United States Patent
Dreps et al.

(10) Patent No.: US 7,529,112 B2
(45) Date of Patent: May 5, 2009

(54) 276-PIN BUFFERED MEMORY MODULE WITH ENHANCED FAULT TOLERANCE AND A PERFORMANCE-OPTIMIZED PIN ASSIGNMENT

(75) Inventors: Daniel M. Dreps, Georgetown, TX (US); Frank D. Ferraiolo, New Windsor, NY (US); Kevin C. Gower, Lagrangeville, NY (US); Roger A. Rippens, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/695,679

(22) Filed: Apr. 3, 2007

(65) Prior Publication Data

US 2007/0288679 A1  Dec. 13, 2007

Related U.S. Application Data

(63) Continuation-in-part of application No. 10/903,371, filed on Jul. 30, 2004, now Pat. No. 7,224,595.

(51) Int. Cl.
*G11C 5/02* (2006.01)
*G11C 5/06* (2006.01)
(52) U.S. Cl. .............................. 365/51; 365/52; 365/63
(58) Field of Classification Search .................... 365/51
See application file for complete search history.

(56) References Cited

U.S. PATENT DOCUMENTS

| | | | |
|---|---|---|---|
| 3,825,904 A | 7/1974 | Burk et al. | 340/172.5 |
| 4,475,194 A | 10/1984 | LaVallee et al. | 371/10 |
| 4,486,739 A | 12/1984 | Franaszek et al. | 340/347 |
| 4,723,120 A | 2/1988 | Petty, Jr. | 340/825.2 |
| 4,740,916 A | 4/1988 | Martin | 364/900 |
| 4,833,605 A | 5/1989 | Terada et al. | 364/200 |
| 4,839,534 A | 6/1989 | Clasen | 307/269 |
| 4,943,984 A | 7/1990 | Pechanek et al. | 375/109 |
| 4,985,828 A | 1/1991 | Shimizu et al. | 364/200 |
| 5,053,947 A | 10/1991 | Heibel et al. | 364/200 |

(Continued)

OTHER PUBLICATIONS

Brown, et al "Compiler-Based I/O Prefetching for Out-of-Core Applications", ACM Transactions on Computer Systems, vol. 19, No. 2, May 2001, pp. 111-170.

(Continued)

*Primary Examiner*—Son L Mai
(74) *Attorney, Agent, or Firm*—Cantor Colburn LLP; Lynn Augspurger

(57) ABSTRACT

A dual inline memory module (DIMM) includes a card having a length of about 151.2 to about 151.5 millimeters, a plurality of individual local memory devices attached to the card, and a buffer device attached to the card, the buffer device configured for converting a packetized memory interface. The card includes at least 276 pins configured thereon including a plurality of high-speed bus interface pills arranged on said card for communicating with a plurality of high-speed busses. The high-speed bus interface pins associated with a single high-speed bus are located on one side of the card with respect to a midpoint of the length of the card, thus the pin assignments are defined such that the performance of the DIMM in a system is optimized for high frequency operation.

14 Claims, 18 Drawing Sheets

U.S. PATENT DOCUMENTS

| | | | |
|---|---|---|---|
| 5,214,747 A | 5/1993 | Cok | 395/27 |
| 5,287,531 A | 2/1994 | Rogers, Jr. et al. | 395/800 |
| 5,387,911 A | 2/1995 | Gleichert et al. | 341/95 |
| 5,454,091 A | 9/1995 | Sites et al. | 395/413 |
| 5,475,690 A | 12/1995 | Burns et al. | 370/105.3 |
| 5,513,135 A | 4/1996 | Dell et al. | 365/52 |
| 5,548,226 A * | 8/1996 | Takekuma et al. | 326/30 |
| 5,592,632 A | 1/1997 | Leung et al. | 395/306 |
| 5,611,055 A | 3/1997 | Krishan et al. | 395/281 |
| 5,613,077 A | 3/1997 | Leung et al. | 395/306 |
| 5,629,685 A | 5/1997 | Allen et al. | 340/825.02 |
| 5,661,677 A | 8/1997 | Rondeau, II et al. | 365/63 |
| 5,666,480 A | 9/1997 | Leung et al. | 395/306 |
| 5,822,749 A | 10/1998 | Agarwal | 707/2 |
| 5,872,996 A | 2/1999 | Barth et al. | 395/853 |
| 5,926,838 A | 7/1999 | Jeddeloh | 711/167 |
| 5,928,343 A | 7/1999 | Farmwald et al. | 710/104 |
| 5,995,405 A | 11/1999 | Trick | 365/63 |
| 6,049,476 A | 4/2000 | Laudon et al. | 365/52 |
| 6,076,158 A | 6/2000 | Sites et al. | 712/230 |
| 6,096,091 A | 8/2000 | Hartmann | 716/17 |
| 6,125,419 A * | 9/2000 | Umemura et al. | 710/110 |
| 6,128,746 A | 10/2000 | Clark et al. | 713/324 |
| 6,170,047 B1 | 1/2001 | Dye | 711/170 |
| 6,170,059 B1 | 1/2001 | Pruett et al. | 713/200 |
| 6,215,686 B1 * | 4/2001 | Deneroff et al. | 365/52 |
| 6,292,903 B1 | 9/2001 | Coteus et al. | 713/401 |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,370,631 B1 | 4/2002 | Dye | 711/170 |
| 6,378,018 B1 | 4/2002 | Tsern et al. | 710/129 |
| 6,393,528 B1 | 5/2002 | Arimilli et al. | 711/137 |
| 6,473,836 B1 | 10/2002 | Ikeda | 711/137 |
| 6,483,755 B2 | 11/2002 | Leung et al. | 365/189.05 |
| 6,487,102 B1 * | 11/2002 | Halbert et al. | 365/51 |
| 6,493,250 B2 | 12/2002 | Halbert et al. | 365/63 |
| 6,496,540 B1 | 12/2002 | Widmer | 375/242 |
| 6,496,910 B1 | 12/2002 | Baentsch et al. | 711/165 |
| 6,502,161 B1 | 12/2002 | Perego et al. | 711/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,532,525 B1 | 3/2003 | Aleksic et al. | 711/168 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | 713/322 |
| 6,601,121 B2 | 7/2003 | Singh et al. | 710/112 |
| 6,611,905 B1 | 8/2003 | Grundon et al. | 711/167 |
| 6,622,217 B2 | 9/2003 | Gharacorloo et al. | 711/141 |
| 6,625,687 B1 | 9/2003 | Halbert et al. | 711/105 |
| 6,625,702 B2 | 9/2003 | Rentschler et al. | |
| 6,631,439 B2 | 10/2003 | Saulsbury et al. | |
| 6,678,811 B2 | 1/2004 | Rentschler et al. | 711/167 |
| 6,697,919 B2 | 2/2004 | Gharachorloo et al. | 711/141 |
| 6,704,842 B1 | 3/2004 | Janakiraman et al. | |
| 6,721,944 B2 | 4/2004 | Chaudhry et al. | |
| 6,738,836 B1 | 5/2004 | Kessler et al. | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,839,393 B1 | 1/2005 | Sidiropoulos | 375/371 |
| 6,877,076 B1 | 4/2005 | Cho et al. | |
| 6,877,078 B2 | 4/2005 | Fujiwara et al. | |
| 6,889,284 B1 | 5/2005 | Nizar et al. | |
| 6,977,536 B2 | 12/2005 | Chin-Chieh et al. | 327/116 |
| 7,224,595 B2 * | 5/2007 | Dreps et al. | 365/63 |
| 7,234,099 B2 * | 6/2007 | Gower et al. | 714/767 |
| 2001/0000822 A1 | 5/2001 | Dell et al. | 711/170 |
| 2001/0003839 A1 | 6/2001 | Kondo | 711/144 |
| 2002/0019926 A1 | 2/2002 | Huppenthal et al | 712/15 |
| 2002/0038405 A1 | 3/2002 | Leddige et al. | 711/115 |
| 2002/0083255 A1 | 6/2002 | Greeff et al. | 710/305 |
| 2002/0103988 A1 | 8/2002 | Dornier | 712/38 |
| 2002/0112119 A1 | 8/2002 | Halbert et al. | 711/115 |
| 2002/0112194 A1 | 8/2002 | Uzelac | 713/500 |
| 2002/0124195 A1 | 9/2002 | Nizar | 713/320 |
| 2002/0147898 A1 | 10/2002 | Rentschler et al. | 711/170 |
| 2002/0174274 A1 | 11/2002 | Wu et al. | 710/100 |
| 2003/0033364 A1 | 2/2003 | Garnett et al. | 709/203 |
| 2003/0090879 A1 | 5/2003 | Doblar et al. | 361/728 |
| 2003/0223303 A1 | 12/2003 | Lamb et al. | 365/230.06 |
| 2003/0236959 A1 | 12/2003 | Johnson et al. | 711/167 |
| 2004/0006674 A1 | 1/2004 | Hargis et al. | 711/156 |
| 2004/0117588 A1 | 6/2004 | Arimilli et al. | 711/203 |
| 2004/0230718 A1 | 11/2004 | Polzin et al. | 710/22 |
| 2004/0246767 A1 | 12/2004 | Vogt | 365/154 |
| 2004/0260909 A1 | 12/2004 | Lee et al. | 711/213 |
| 2004/0260957 A1 | 12/2004 | Jeddeloh et al. | 713/300 |
| 2005/0050237 A1 | 3/2005 | Jeddeloh et al. | 710/10 |
| 2005/0050255 A1 | 3/2005 | Jeddeloh | 710/317 |
| 2005/0066136 A1 | 3/2005 | Schnepper | 711/154 |
| 2005/0080581 A1 | 4/2005 | Zimmerman et al. | 702/117 |
| 2005/0097249 A1 | 5/2005 | Oberlin et al. | |
| 2005/0120157 A1 | 6/2005 | Chen et al. | 710/313 |
| 2005/0125702 A1 | 6/2005 | Huang et al. | 713/320 |
| 2005/0125703 A1 | 6/2005 | Lefurgy et al. | 713/320 |
| 2005/0144399 A1 | 6/2005 | Hosomi | 711/145 |
| 2005/0177690 A1 | 8/2005 | LaBerge | 711/154 |
| 2005/0229132 A1 | 10/2005 | Butt et al. | 716/10 |
| 2005/0259496 A1 | 11/2005 | Hsu et al. | 365/226 |
| 2006/0036826 A1 * | 2/2006 | Dell et al. | 711/167 |
| 2006/0050488 A1 * | 3/2006 | Goodwin | 361/749 |
| 2007/0195572 A1 * | 8/2007 | Dreps et al. | 365/63 |

OTHER PUBLICATIONS

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

JEDEC Solid State Technology Association, "JEDEC Standard: DDR2 SDRAM Specification", Jan. 2004, JEDEC, Revision JESD79-2A, p. 10.

Jungjoon Kim et al.; "Performance and Architecture Features of Segmented Multiple Bus System;" IEEE Computer Society; 1999 International Conference on Parallel Processing (ICP '99).

Natarajan, et al., "A Study of Performance Impact of Memory Controller Features in Multi-Processor Server Environment", pp. 80-87, 2004.

Nilsen, "High-Level Dynamic Memory Management for Object-Oriented Real-Time Systems", pp. 86-93.

Penrod, Lee, "Understanding System Memory and CPU Speeds: A laymans guide to the Front Side Bus (FSB)", Dec. 28, 2005, Direction. Org, pp. 1-5, http://www.direction.com/direction/fsbguide.html. [online ]; [retrieved on Feb. 23, 2006]; retrieved from the Internet.

Seceleanu et al.; "Segment Arbiter as Action System;" IEEE 2003 pp. 249-252.

Sivencrona et al.; "RedCAN™: Simulations of two Fault Recovery Algorithms for CAN;" Proceedings for the 10th IEEE Pacific Rim International Symposium on Dependable Computing (PRDC'04); 2005.

Wang, et al., "Guided Region Prefetching: A Cooperative Hardware/Software Approach", pp. 388-398.

* cited by examiner

TYPICAL LARGE-SYSTEM MEMORY CONFIGURATION

| Buffer Mode | # Memory Ranks per DIMM | # of Buffer CS Outputs Used / Loads per CS | # Buffer Clock Pairs Used / Loads per Clock Pair | Misc |
|---|---|---|---|---|
| Buffer DIMM | 1 | 2 / 4-5 Loads | 2 / 4-5 Loads | 'Fly-by' topology |
|  | 2 | 4 / 4-5 Loads | 4 / 4-5 Loads | 'Fly-by' topology |
|  | 4 | 8 / 4-5 Loads | 6 / 6 Loads | 'Fly-by' topology |
|  | 8 | 8 / 9 Loads | 6 / 12 Loads | 'Fly-by' / "T" topology |
| Registered DIMM | 1 | 2 / 1 or 2 Loads | 2 / 1 or 2 Loads | Inputs wire to register or PLL (Clock) Direct connect or point to point |
|  | 2 | 4 / 1 or 2 Loads | 4 / 1 or 2 Loads | Inputs wire to register or PLL (Clock) Direct connect or point to point |
| Unbuffered DIMM | 1 | 2 / 4-9 Loads | 6 / 1-3 Loads | 'T' net topology |
|  | 2 | 2 / 8-18 Loads | 6 / 2-6 Loads | 'T' net topology |

FIG. 12

| TOP Pin Number | BOTTOM Pin Number | TOP Pin Function | BOTTOM Pin Function | Distance From Center Notch (or Key) left or right of notch |
|---|---|---|---|---|
| 1 | 139 | 1.8V | 1.8V | 81.5 Distance To left of notch (front view) |
| 2 | 140 | vref_test | 1.8V | 80.5 |
| 3 | 141 | scope_trigger(0) | scope_trigger(1) | 79.5 |
| 4 | 142 | fault_n | fault_n_r | 78.5 |
| 5 | 143 | 1.8V | 1.2V | 77.5 |
| 6 | 144 | 1.2V | s3_ds(0) | 76.5 |
| 7 | 145 | us_s3(0) | GND | 75.5 |
| 8 | 146 | GND | s3_ds(1) | 74.5 |
| 9 | 147 | us_s3(1) | 1.2V | 73.5 |
| 10 | 148 | 1.2V | s3_ds(2) | 72.5 |
| 11 | 149 | us_s3(2) | GND | 71.5 |
| 12 | 150 | GND | s3_ds(3) | 70.5 |
| 13 | 151 | us_s3(3) | 1.2V | 69.5 |
| 14 | 152 | 1.2V | s3_ds(4) | 68.5 |
| 15 | 153 | us_s3(4) | GND | 67.5 |
| 16 | 154 | GND | s3_ds(5) | 66.5 |
| 17 | 155 | us_s3(5) | 1.2V | 65.5 |
| 18 | 156 | 1.2V | s3_ds(6) | 64.5 |
| 19 | 157 | us_s3(6) | GND | 63.5 |
| 20 | 158 | GND | 1.8V | 62.5 |
| 21 | 159 | 1.8V | 1.8V | 61.5 |
| 22 | 160 | 1.8V | 1.8V | 60.5 |
| 23 | 161 | 1.8V | GND | 59.5 |
| 24 | 162 | GND | s3_ds(7) | 58.5 |
| 25 | 163 | us_s3(7) | 1.2V | 57.5 |
| 26 | 164 | 1.2V | s3_ds(8) | 56.5 |
| 27 | 165 | us_s3(8) | GND | 55.5 |
| 28 | 166 | GND | s3_ds(9) | 54.5 |
| 29 | 167 | us_s3(9) | 1.2V | 53.5 |
| 30 | 168 | 1.2V | s3_ds(10) | 52.5 |
| 31 | 169 | us_s3(10) | GND | 51.5 |
| 32 | 170 | GND | s3_ds(11) | 50.5 |
| 33 | 171 | us_s3(11) | 1.2V | 49.5 |
| 34 | 172 | 1.2V | s3_ds(12) | 48.5 |
| 35 | 173 | us_s3(12) | GND | 47.5 |
| 36 | 174 | GND | s3_ds(13) | 46.5 |
| 37 | 175 | us_s3(13) | 1.2V | 45.5 |
| 38 | 176 | 1.2V | s3_ds(14) | 44.5 |
| 39 | 177 | us_s3(14) | GND | 43.5 |
| 40 | 178 | GND | s3_ds(15) | 42.5 |
| 41 | 179 | us_s3(15) | 1.2V | 41.5 |
| 42 | 180 | 1.2V | s3_ds(16) | 40.5 |
| 43 | 181 | us_s3(16) | GND | 39.5 |
| 44 | 182 | GND | s3_ds(17) | 38.5 |
| 45 | 183 | us_s3(17) | 1.2V | 37.5 |
| 46 | 184 | 1.2V | us_s3_clk_n_r | 36.5 |
| 47 | 185 | us_s3_clk_n | us_s3_clk_p_r | 35.5 |
| 48 | 186 | us_s3_clk_p | 1.8V | 34.5 |
| 49 | 187 | 1.8v | s3_ds_clk_n_r | 33.5 |
| 50 | 188 | s3_ds_clk_n | s3_ds_clk_p_r | 32.5 |
| 51 | 189 | s3_ds_clk_p | GND | 31.5 |
| 52 | 190 | GND | s3_ds(18) | 30.5 |
| 53 | 191 | us_s3(18) | 1.2V | 29.5 |
| 54 | 192 | 1.2V | s3_ds (19) | 28.5 |

| 16a |
|---|
| 16b |
| 16c |

| | | | | |
|---|---|---|---|---|
| 55 | 193 | us_s3(19) | GND | 27.5 |
| 56 | 194 | GND | s3_ds(20) | 26.5 |
| 57 | 195 | us_s3(20) | 1.2V | 25.5 |
| 58 | 196 | 1.2V | s3_ds(21) | 24.5 |
| 59 | 197 | us_s3(21) | GND | 23.5 |
| 60 | 198 | GND | 1.8V | 22.5 |
| 61 | 199 | fsi0_data | fsi0_data_r | 21.5 |
| 62 | 200 | fsi1_data | fsi1_data_r | 20.5 |
| 63 | 201 | 1.8V | GND | 19.5 |
| 64 | 202 | fsi1_clk | fsi1_clk_r | 18.5 |
| 65 | 203 | fsi0_clk | fsi0_clk_r | 17.5 |
| 66 | 204 | SA0 | SA0_r | 16.5 |
| 67 | 205 | vddstby | vddstby | 15.5 |
| 68 | 206 | PLL_VDDA | PLL_VDDA | 14.5 |
| 69 | 207 | VDDSPD | VDDSPD | 13.5 |
| 70 | 208 | 1.8V | 1.8V | 12.5 |
| 71 | 209 | next_fsi1_data | next_fsi1_data_r | 11.5 |
| 72 | 210 | next_fsi1_clk | next_fsi1_clk_r | 10.5 |
| 73 | 211 | GND | 1.2V | 9.5 |
| 74 | 212 | next_fsi0_data | next_fsi0_data_r | 8.5 |
| 75 | 213 | next_fsi0_clk | next_fsi0_clk_r | 7.5 |
| 76 | 214 | cfam_reset_b | cfam_reset_b_r | 6.5 |
| 77 | 215 | 1.8V | GND | 5.5 |
| 78 | 216 | GND | ds_s3(0) | 4.5 |
| 79 | 217 | s3_us(0) | 1.2V | 3.5 |
| 80 | 218 | 1.2V | ds_s3(1) | 2.5 Distance To left of notch (front view) |
| Notch | Notch | | | |
| 81 | 219 | s3_us(1) | GND | 2.5 Distance To right of notch (front view) |
| 82 | 220 | GND | ds_s3(2) | 3.5 |
| 83 | 221 | s3_us(2) | 1.2V | 4.5 |
| 84 | 222 | 1.2V | s3_us_clk_n_r | 5.5 |
| 85 | 223 | s3_us_clk_n | s3_us_clk_p_r | 6.5 |
| 86 | 224 | s3_us_clk_p | 1.8V | 7.5 |
| 87 | 225 | 1.8V | ds_s3_clk_n_r | 8.5 |
| 88 | 226 | ds_s3_clk_n | ds_s3_clk_p_r | 9.5 |
| 89 | 227 | ds_s3_clk_p | GND | 10.5 |
| 90 | 228 | GND | ds_s3(3) | 11.5 |
| 91 | 229 | s3_us(3) | 1.2V | 12.5 |
| 92 | 230 | 1.2V | ds_s3(4) | 13.5 |
| 93 | 231 | s3_us(4) | GND | 14.5 |
| 94 | 232 | GND | ds_s3(5) | 15.5 |
| 95 | 233 | s3_us(5) | 1.2V | 16.5 |
| 96 | 234 | 1.2V | ds_s3(6) | 17.5 |
| 97 | 235 | s3_us(6) | GND | 18.5 |
| 98 | 236 | GND | ds_s3(7) | 19.5 |
| 99 | 237 | s3_us(7) | 1.2V | 20.5 |
| 100 | 238 | 1.2V | ds_s3(8) | 21.5 |
| 101 | 239 | s3_us(8) | GND | 22.5 |
| 102 | 240 | GND | ds_s3(9) | 23.5 |
| 103 | 241 | s3_us(9) | 1.2V | 24.5 |
| 104 | 242 | 1.2V | ds_s3(10) | 25.5 |
| 105 | 243 | s3_us(10) | GND | 26.5 |
| 106 | 244 | GND | ds_s3(11) | 27.5 |

FIG. 16b

| | | | | |
|---|---|---|---|---|
| 107 | 245 | s3_us(11) | 1.2V | 28.5 |
| 108 | 246 | 1.2V | ds_s3(12) | 29.5 |
| 109 | 247 | s3_us(12) | GND | 30.5 |
| 110 | 248 | GND | ds_s3(13) | 31.5 |
| 111 | 249 | s3_us(13) | 1.2V | 32.5 |
| 112 | 250 | 1.2V | 1.8V | 33.5 |
| 113 | 251 | 1.8V | 1.8V | 34.5 |
| 114 | 252 | 1.8V | 1.8V | 35.5 |
| 115 | 253 | 1.8V | GND | 36.6 |
| 116 | 254 | GND | ds_s3(14) | 37.5 |
| 117 | 255 | s3_us(14) | 1.2V | 38.5 |
| 118 | 256 | 1.2V | ds_s3(15) | 39.5 |
| 119 | 257 | s3_us(15) | GND | 40.5 |
| 120 | 258 | GND | ds_s3(16) | 41.5 |
| 121 | 259 | s3_us(16) | 1.2V | 42.5 |
| 122 | 260 | 1.2V | ds_s3(17) | 43.5 |
| 123 | 261 | s3_us(17) | GND | 44.5 |
| 124 | 262 | GND | ds_s3(18) | 45.5 |
| 125 | 263 | s3_us(18) | 1.2V | 46.5 |
| 126 | 264 | 1.2V | ds_s3(19) | 47.5 |
| 127 | 265 | s3_us(19) | GND | 48.5 |
| 128 | 266 | GND | ds_s3(20) | 49.5 |
| 129 | 267 | s3_us(20) | 1.2V | 50.5 |
| 130 | 268 | 1.2V | ds_s3(21) | 51.5 |
| 131 | 269 | s3_us(21) | GND | 52.5 |
| 132 | 270 | GND | ds_s3(22) | 53.5 |
| 133 | 271 | s3_us(22) | 1.2V | 54.5 |
| 134 | 272 | 1.2V | 1.8V | 55.5 |
| 135 | 273 | scl | scl_r | 56.5 |
| 136 | 274 | sda | sda_r | 57.5 |
| 137 | 275 | fsi_sel_b | fsi_sel_b_r | 58.5 |
| 138 | 276 | 1.8V | 1.8V | 59.5 Distance To right of notch (front view) |

FIG. 16c

276-PIN BUFFERED MEMORY MODULE WITH ENHANCED FAULT TOLERANCE AND A PERFORMANCE-OPTIMIZED PIN ASSIGNMENT

CROSS REFERENCE TO RELATED APPLICATION

This application is a continuation in part application of U.S. Ser. No. 10/903,371, filed Jul. 30, 2004, U.S. Pat. No. 7,224,595 the contents of which are incorporated by reference herein in their entirety.

BACKGROUND OF THE INVENTION

The invention relates to computer memory subsystems and, more particularly, to a buffered memory module having enhanced fault tolerance and a performance-optimized pin assignment.

Computer memory subsystems have evolved over the years, but continue to retain many consistent attributes. Computer memory subsystems from the early 1980's, such as the one disclosed in U.S. Pat. No. 4,475,194 to LeVallee et al, of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al, of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al, of common assignment herewith, depicts a simplified diagram and description of a memory subsystem 10 that includes up to four registered dual inline memory modules (DIMMs) 40 on a traditional multi-drop stub bus channel. The subsystem includes a memory controller 20, an external clock buffer 30, registered DIMMs 40, address bus 50, control bus 60 and a data bus 70 with terminators 95 on the address bus 50 and data bus 70.

FIG. 4 depicts a 1990's memory subsystem which evolved from the structure in FIG. 1 and included a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723,120. The memory controller is connected to a memory bus 315, which further connects to module 310a. The information on bus 315 is re-driven by the buffer on module 310a to the next module, 310b, which further re-drives the bus 315 to module positions denoted as 310n. Each module 310a includes a DRAM 311a and a buffer 320a. The bus 315 may be described as having a daisy chain structure, with each bus being point-to-point in nature.

As new systems emerge which offer enhanced performance, improved reliability and/or reduced power consumption, customers will often replace existing systems with these new systems. To reduce total purchase cost, however, many may wish to re-use many or all of their storage devices in the new system—often in conjunction with the new storage technology of that system, in order to take advantage of the increased speed and density. At the same time, it is also desirable to be able to provide the high-speed, high-density storage capability in a reliable manner that is resistant to faults such as pin discontinuity, single points-of-failure, and other related faults, as well as supporting increased DRAM body widths therein.

BRIEF SUMMARY OF THE INVENTION

Exemplary embodiments of the present invention include a dual inline memory module (DIMM) including a card having a length of about 151.2 to about 151.5 millimeters, a plurality of individual local memory devices attached to the card, and a buffer device attached to the card, the buffer device configured for converting a packetized memory interface. The card includes at least 276 pins configured thereon including a plurality of high-speed bus interface pins arranged on said card for communicating with a plurality of high-speed busses. The high-speed bus interface pins associated with a single high-speed bus are located on one side of the card with respect to a midpoint of the length of the card.

Further exemplary embodiments include a dual inline memory module (DIMM), including a card having a length of about 151.35 millimeters, a plurality of individual local memory devices attached to the card, and a buffer device attached to the card. The buffer device is configured to redrive information to one or more external memory modules in a cascaded manner. The card includes a plurality of high-speed bus interface pins arranged on the card for communicating with a plurality of high-speed busses, such that the high-speed bus interface pins associated with a single high-speed bus are located on one side of the card with respect to a midpoint of the length of the card.

Additional exemplary embodiments include a computer memory system, including a dual inline memory module (DIMM) including a card having a length of about 151.2 to about 151.5 millimeters, a plurality of individual local memory devices attached to the card, and a buffer device attached to the card, the buffer device configured for converting a packetized memory interface. The card includes a plurality of high-speed bus interface pins arranged on the card for communicating with a plurality of high-speed busses, such that the high-speed bus interface pins associated with a single high-speed bus are located on one side of the card with respect to a midpoint of the length of the card.

BRIEF DESCRIPTION OF THE DRAWINGS

Referring now to the drawings wherein like elements are numbered alike in the several FIGURES:

FIG. 12 is a table that includes typical applications and operating modes of exemplary buffer devices;

FIG. 16 is made up of FIG. 16a, 16b and 16c, and depicts a table illustrating a functional pin layout of the exemplary 276-pin DIMM of FIG. 10, in accordance with an embodiment of the invention.

DETAILED DESCRIPTION OF THE PREFERRED EMBODIMENTS

Exemplary embodiments of the present invention include a flexible, high speed and high reliability memory system architecture and high performance-optimized interconnect structure that includes a single-ended point-to-point interconnection between any two high-speed communication interfaces. The memory subsystem may be implemented in one of several structures, depending on desired attributes such as reliability, performance, density, space, cost, component reuse and other elements. A bus-to-bus converter chip enables this flexibility through the inclusion of multiple, selectable memory interface modes. This maximizes the flexibility of the system designers in defining optimal solutions for each installation, while minimizing product development costs and maximizing economies of scale through the use of a common device. In addition, exemplary embodiments of the present invention provide a migration path that allows an installation to implement a mix of buffered memory modules and unbuffered and/or registered memory modules from a common buffer device.

Memory subsystems may utilize a buffer device to support buffered memory modules (directly connected to a memory controller via a packetized, multi-transfer interface with enhanced reliability features) and/or existing unbuffered or registered memory modules (in conjunction with the identical buffer device, on an equivalent but, programmed to operate in a manner consistent with the memory interface defined for those module types). A memory subsystem may communicate with buffered memory modules at one speed and with unbuffered and registered memory modules at another speed (typically a slower speed). Many attributes associated with the buffered module structure are maintained, including the enhanced high-speed bus error detection and correction features and the memory cascade function. However, overall performance may be reduced when communicating with most registered and unbuffered DIMMs due to the net topologies and loadings associated with them.

Figure 4:
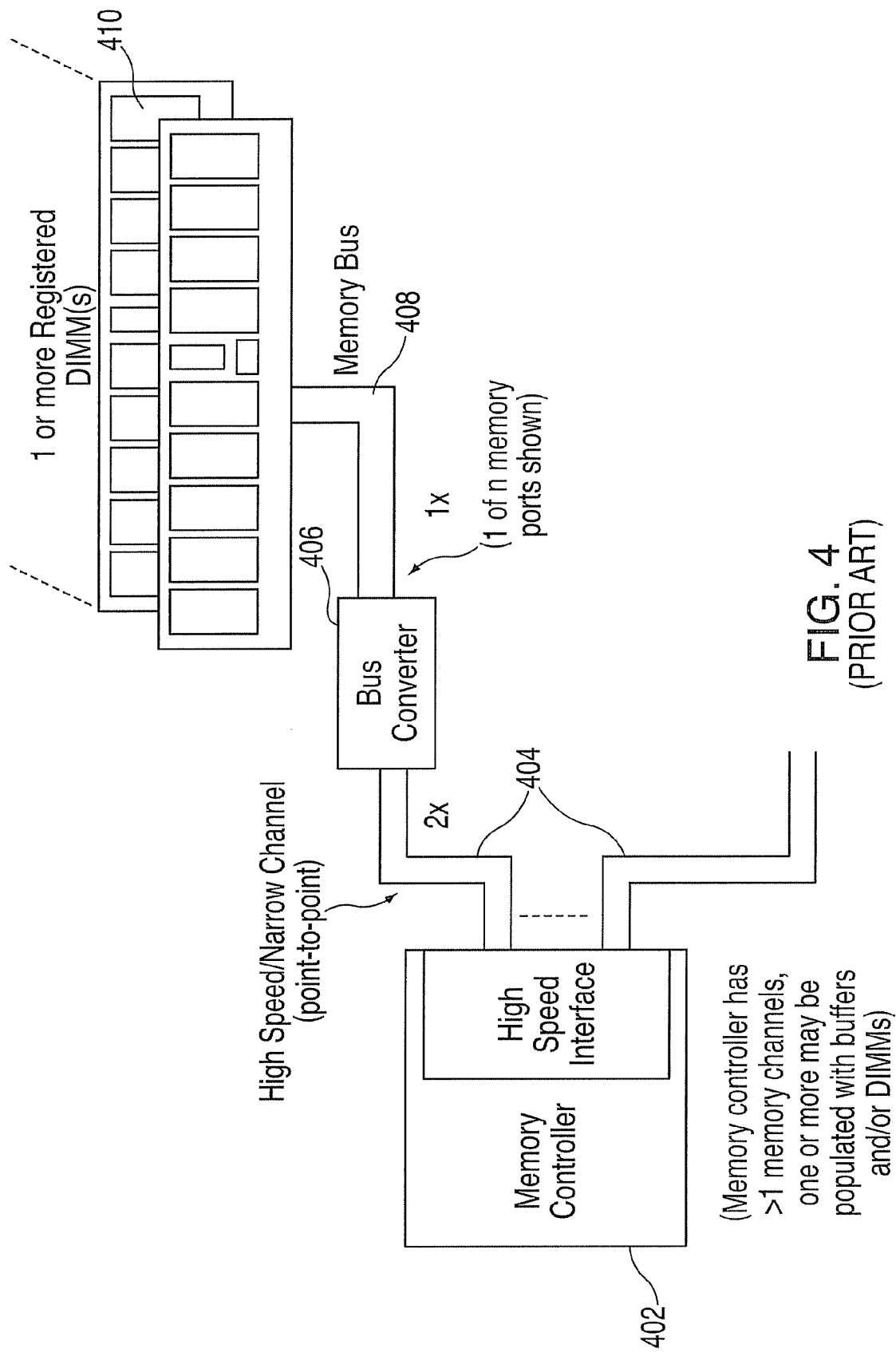
FIG. 4 depicts a prior art memory subsystem with point-to-point channels, registered DIMMs, and a 2:1 bus speed multiplier
Figure 5:
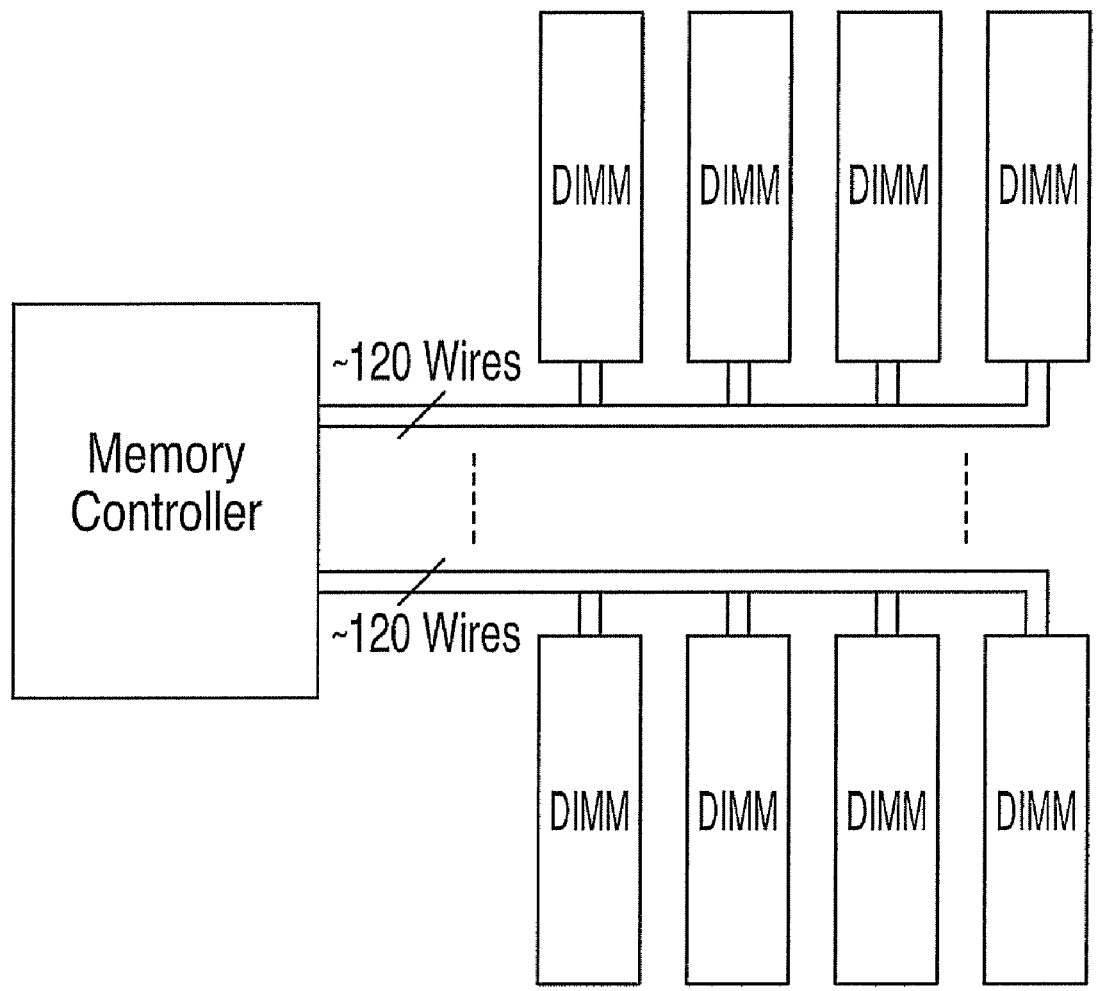
FIG. 5 depicts a prior art memory structure that utilizes a multidrop memory 'stub' bus.
Figure 6:
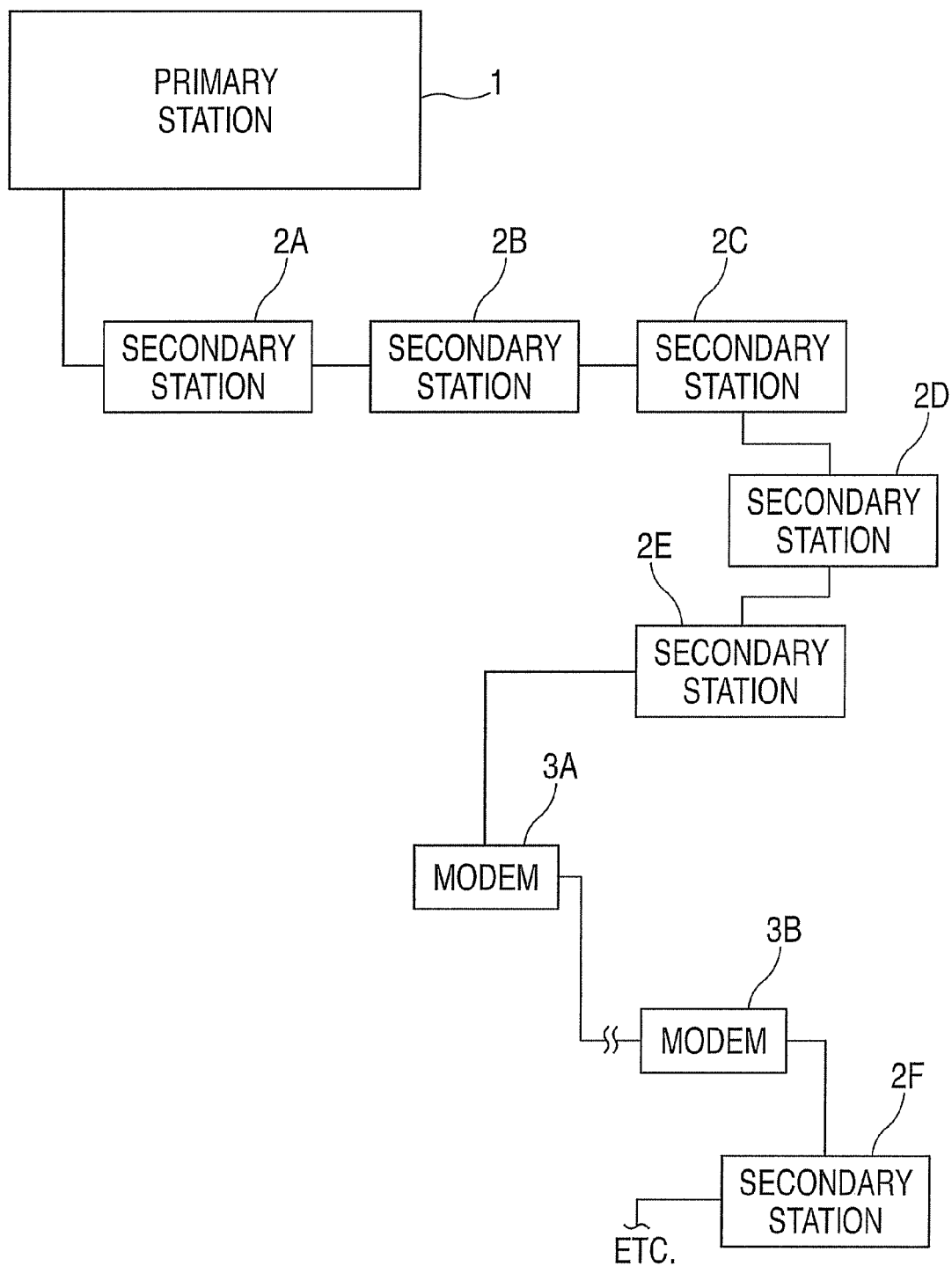
FIG. 6 depicts a prior art daisy chain structure in a multi-point communication structure that would otherwise require multiple ports.
Figure 7:
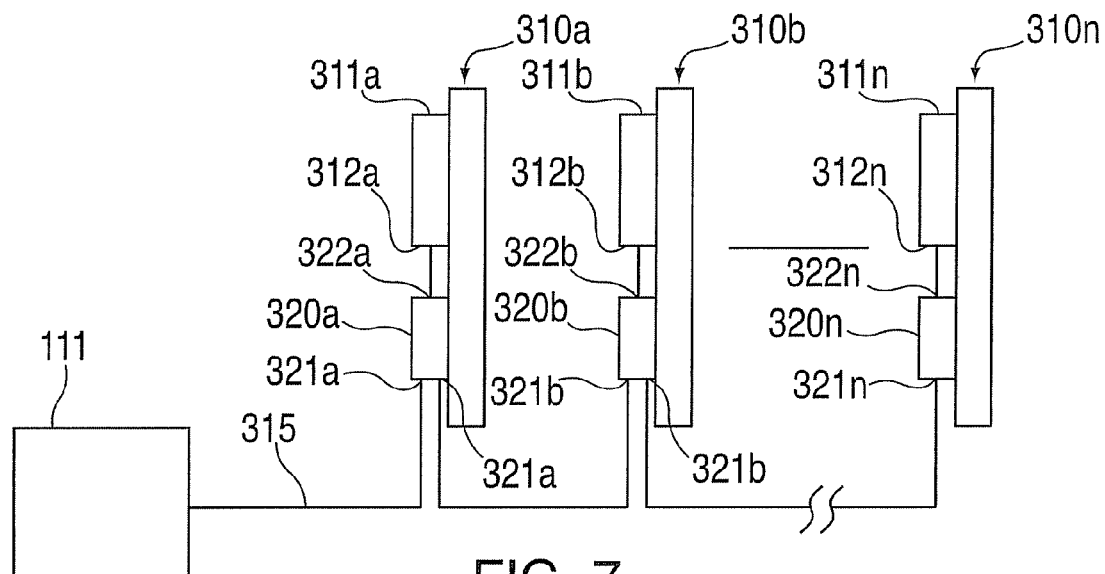
FIG. 7 depicts a prior art daisy chain connection between a memory controller and memory modules.
Figure 8:
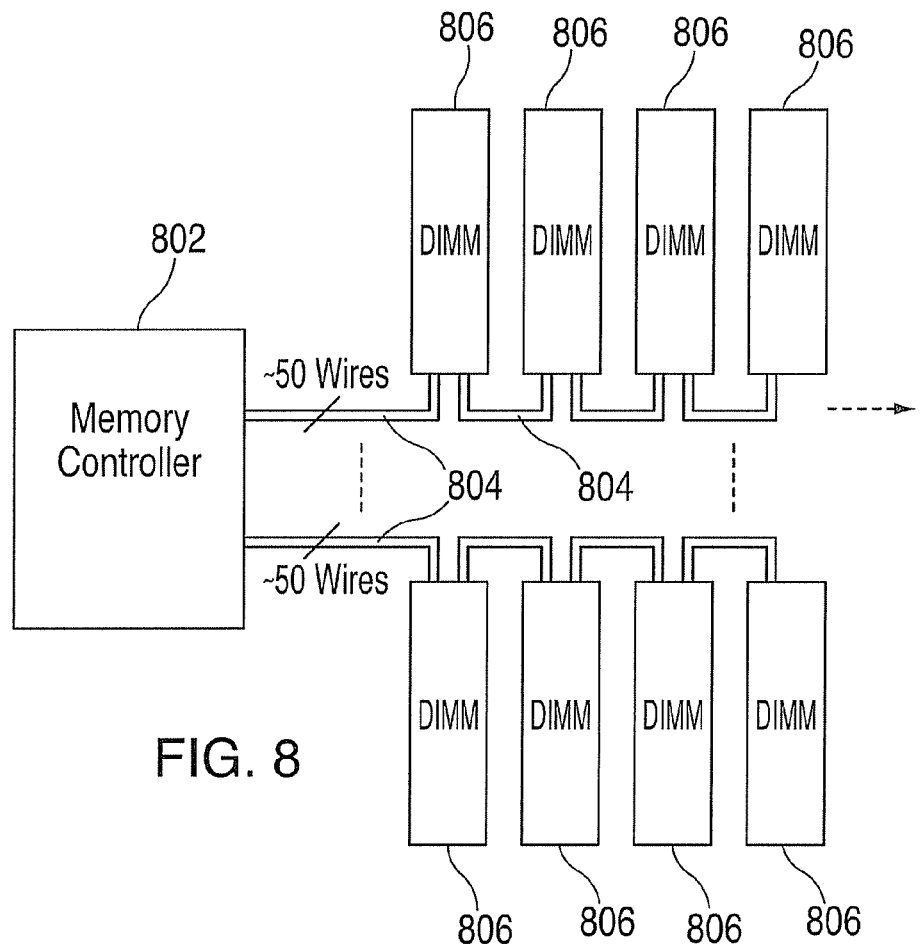
FIG. 8 depicts a cascaded memory structure that is utilized by exemplary embodiments of the present invention.

FIG. 8 depicts a cascaded memory structure that may be utilized by exemplary embodiments of the present invention when buffered memory modules 806 (e.g., the buffer device is included within the memory module 806) are in communication with the memory controller 802. This memory structure includes a memory controller 802 in communication with one or more memory modules 806 via a high-speed point-to-point bus 804. Each bus 804 in the exemplary embodiment depicted in FIG. 8 includes approximately fifty high-speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066

Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and minimize pin-count.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module, to permit memory modules to be cascaded such that each memory module is interconnected to other memory modules as well as to the memory controller 802.

Figure 9:
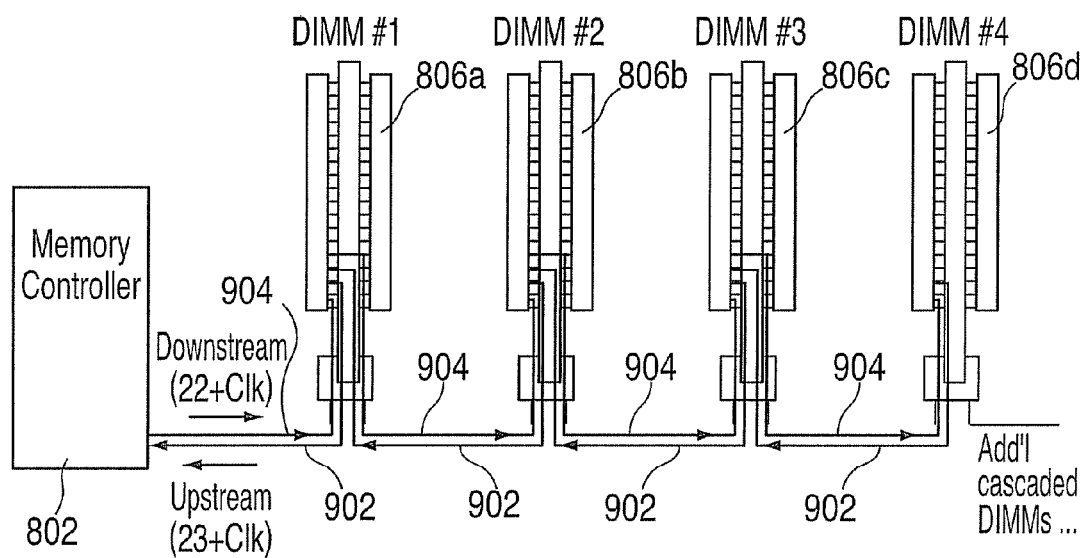
FIG. 9 depicts a memory structure with cascaded memory modules and unidirectional busses that is utilized by exemplary embodiments of the present invention.

FIG. 9 depicts a memory structure with cascaded memory modules and unidirectional busses that are utilized by exemplary embodiments of the present invention if all of the memory modules 806 are buffered memory modules 806. One of the functions provided by the memory modules 806 in the cascade structure is a redrive function to send signals on the memory bus to other memory modules 806 or to a memory controller 802. FIG. 9 includes a memory controller 802 and four memory modules 806a, 806b, 806c and 806d, on each of two memory busses (a downstream memory bus 904 and an upstream memory bus 902), connected to the memory controller 802 in either a direct or cascaded manner. Memory module 806a is connected to the memory controller 802 in a direct manner. Memory modules 806b, 806c and 806d are connected to the controller 802 in a cascaded manner.

An exemplary embodiment of the present invention includes two unidirectional busses between the memory controller 802 and memory module 806a ("DIMM #1") as well as between each successive memory module 806b-d ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, data and error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer bus-level data and ECC bits upstream from the sourcing memory module 806 to the memory controller 802. Using this memory structure, and a four to one data rate multiplier between the DRAM data rate (e.g., 400 to 1066 Mb/s per pin) and the unidirectional memory bus data rate (e.g., 1.6 to 4.26 Gb/s per pin), the memory controller 802 signal pincount, per memory channel, is reduced from approximately one hundred and twenty pins to about fifty pins.

Figure 10:
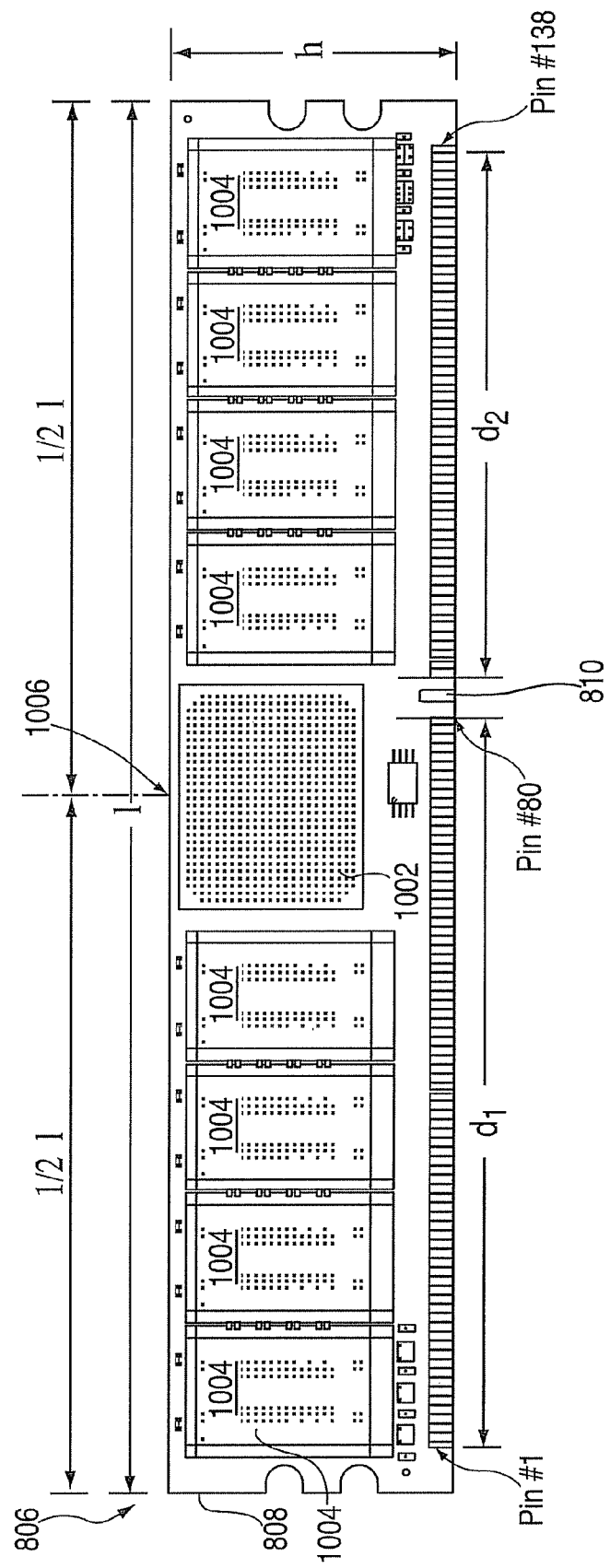
FIG. 10 is a front view of a 276-pin, buffered memory module (DIMM) that is utilized by exemplary embodiments of the present invention.

FIG. 10 depicts a front view of a buffered memory module 806 that is utilized by exemplary embodiments of the present invention. In exemplary embodiments of the present invention, each memory module 806 includes a blank card having dimensions of approximately six inches long by one and a half inches tall, eighteen DRAM positions, a multi-mode buffer device 1002, and numerous small components as known in the art that are not shown and/or identified but are included in exemplary embodiments, such as capacitors, resistors and, EEPROM(s). In an exemplary embodiment of the present invention, the dimension of the card is 5.97 inches long by 1.2 inches tall. In an exemplary embodiment of the present invention, the multi-mode buffer device 1002 is located in the center region of the front side of the memory module 806, as depicted in FIG. 10. The synchronous DRAMS (SDRAMS) 1004 are located on either side of the multi-mode buffer device 1002, as well as on the backside of the memory module 806, which is not shown. The configuration may be utilized to facilitate high speed wiring to the multi-mode buffer device 1002 as well as signals from the buffer device to the SDRAMs 1004.

In further exemplary embodiments, thirty six, seventy two or other memory device positions may be included on the memory module, and the card height may be increased or decreased commensurate with the dimensional requirements of the memory devices in addition to the additional area for support devices (e.g. capacitors and/or resistors) and wiring. As described later, higher memory device counts will generally result in the need to operate the memory module at lower data rates, due to factors such as increased loading on signals, longer signal traces, increased skew, etc.

The DRAM package outline is a combination of a tall/narrow (i.e., rectangular) DRAM package and a short/wide (i.e., squarish) DRAM package. Thus configured, a single card design may accommodate either "tall" or "wide" DRAM device/package combinations, consistent with historical and projected device trends. Moreover, the exemplary buffer device 1002 is rectangular in shape, thereby permitting a minimum distance between high-speed package interconnects and the DIMM tab pins, as well as reducing the distance the high-speed signals must travel under the package to reach an available high-speed pin, when an optimal ground referencing structure is used.

As is also shown in FIG. 10, the location of a positioning key 810 (notch) is specifically shifted from the midpoint of the length, l, of the card 808 (with respect to prior generation models) in order to ensure the DIMM cannot be fully inserted into a connector intended for a different module type. In addition, the positioning key location also prevents reverse insertion of the DIMM, and allows for a visual aid to the end-user regarding proper DIMM insertion. In the example illustrated, the positioning key 810 is located between pins 80/218 and 81/219. As such, the distance $d_1$ along the length, l, of the card 808 is larger than the distance $d_2$. FIG. 10 also depicts a midpoint 1006 with respect to the length of the card. As such, the distance on either side of the midpoint 1006 is represented as "½l" in FIG. 10.

Figure 11:
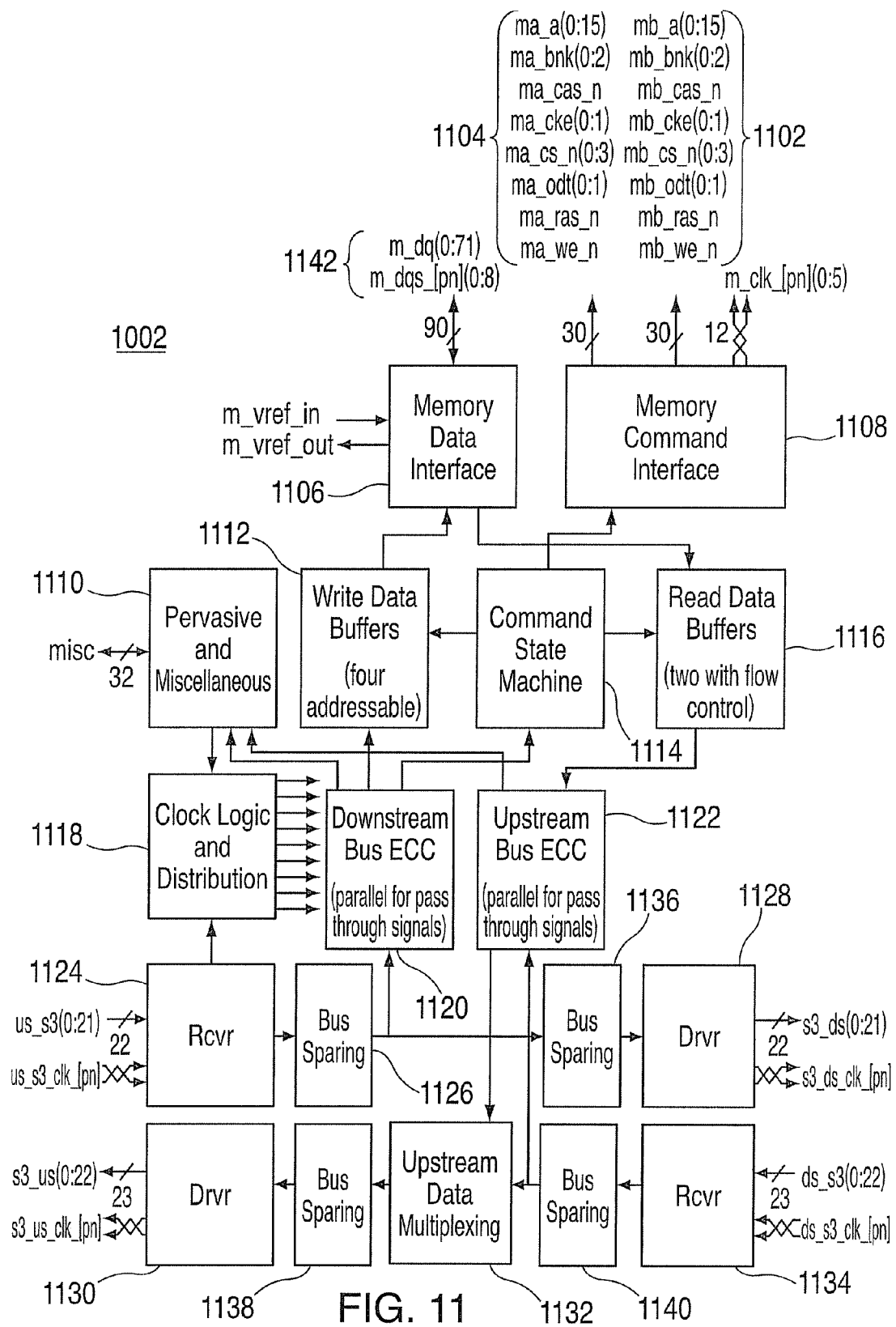
FIG. 11 is a block diagram of a multi-mode buffer device high level logic flow as utilized by exemplary embodiments of the present invention.

FIG. 11 is a block diagram of the high level logic flow of a multi-mode buffer device 1002 utilized by exemplary embodiments of the present invention. The multi-mode multi-mode buffer device 1002 may be located on a memory module 806 as described previously and/or located on a system board or card to communicate with unbuffered and registered memory modules. The blocks in the lower left and right portions of the drawing (1124, 1128, 1130, 1134) are associated with receiving or driving the high speed bus 804. "Upstream" refers to the bus 902 passing information in the direction of the memory controller 802, and "downstream" refers to the bus 904 passing information away from the memory controller 802.

Referring to FIG. 11, data, command, address, ECC, and clock signals from an upstream memory assembly (i.e., a memory module 806) or a memory controller 802 are received from the downstream memory bus 904 into a receiver module 1124. The receiver functional block 1124 provides macros and support logic for the downstream memory bus 904 and, in an exemplary embodiment of the present invention includes support for a twenty-two bit, high speed, slave receiver bus. The receiver functional block 1124 transmits the clock signals to a clock logic and distribution functional block 1118 (e.g., to generate the four to one clock signals). The clock logic and distribution functional block 1118 also receives data input from the pervasive and miscellaneous signals 1110. These signals typically include control and setup information for the clock distribution PLL's, test inputs for BIST (built-in self-test) modes, programmable timing settings, etc. The receiver functional block 1124 transfers the data, command, ECC and address signals to a bus sparing logic block 1126 to reposition, when applicable, the bit placement of the data in the event that a spare wire utilized during the transmission from the previous memory assembly. In an exemplary embodiment of the present invention, the bus sparing logic block 1126 is implemented by a multiplexor to shift the signal positions, if needed. Next, the original or re-ordered signals are input to another bus sparing logic block 1136 to modify, or reorder if necessary, the signal placement to account for any defective interconnect that may exist between the current memory assembly and a downstream memory assembly. The original or re-ordered signals are then input to a driver functional block 1128 for transmission, via the downstream memory bus 904, to the next memory module 806 in the chain. In an exemplary embodiment of the present invention, the bus sparing logic 1136 is implemented using a multiplexor. The driver functional block 1128 provides macros and support logic for the downstream memory bus 904 and, in an exemplary embodiment of the present invention, includes support for the twenty-two bit, high speed, low latency cascade bus drivers.

In addition to inputting the original or re-ordered signals to the bus sparing logic 1136, the bus sparing logic 1126 also inputs the original or re-ordered signals into a downstream bus ECC functional block 1120 to perform error detection and correction for the frame. The downstream bus ECC functional block 1120 operates on any information received or passed through the multi-mode buffer device 1002 from the downstream memory bus 904 to determine if a bus error is present. The downstream bus ECC functional block 1120 analyzes the bus signals to determine if it they are valid. Next, the downstream bus ECC functional block 1120 transfers the corrected signals to a command state machine 1114. The command state machine 1114 inputs the error flags associated with command decodes or conflicts to a pervasive and miscellaneous functional block 1110. The downstream and upstream modules also present error flags and/or error data (if any) to the pervasive and miscellaneous functional block 1110 to enable reporting of these errors to the memory controller, processor, service processor or other error management unit.

Referring to FIG. 11, the pervasive and miscellaneous functional block 1110 transmits error flags and/or error data to the memory controller 802. By collecting error flags and/or error data from each memory module 806 in the chain, the memory controller 802 will be able to identify the failing segment(s), without having to initiate further diagnostics, though additional diagnostics may be completed in some embodiments of the design. In addition, once an installation selected threshold (e.g., one, two, ten, or twenty) for the number of failures or type of failures has been reached, the pervasive and miscellaneous functional block 1110, generally in response to inputs from the memory controller 802, may substitute the spare wire for the segment that is failing. In an exemplary embodiment of the present invention, error detection and correction is performed for every group of four transfers, thereby permitting operations to be decoded and initiated after half of the eight transfers, comprising a frame, are received. The error detection and correction is performed for all signals that pass through the memory module 806 from the downstream memory bus 904, regardless of whether the signals are to be processed by the particular memory module 806. The data bits from the corrected signals are input to the write data buffers 1112 by the downstream bus ECC functional block 1120.

The command state machine 1114 also determines if the corrected signals (including data, command and address signals) are directed to and should be processed by the memory module 806. If the corrected signals are directed to the memory module 806, then the command state machine 1114 determines what actions to take and may initiate DRAM action, write buffer actions, read buffer actions or a combination thereof. Depending on the type of memory module 806 (buffered, unbuffered, registered), the command state machine 1114 selects the appropriate drive characteristics, timings and timing relationships. The write data buffers 1112 transmit the data signals to a memory data interface 1106 and the command state machine 1114 transmits the associated addresses and command signals to a memory command interface 1108, consistent with the DRAM specification. The memory data interface 1106 reads from and writes memory data 1142 to a memory device.

Data signals to be transmitted to the memory controller 802 may be temporarily stored in the read data buffers 1116 after a command, such as a read command, has been executed by the memory module 806, consistent with the memory device 'read' timings. The read data buffers 1116 transfer the read data into an upstream bus ECC functional block 1122. The upstream bus ECC functional block 1122 generates check bits for the signals in the read data buffers 1116. The check bits and signals from the read data buffers 1116 are input to the upstream data multiplexing functional block 1132. The upstream data multiplexing functional block 1132 merges the data on to the upstream memory bus 902 via the bus sparing logic 1138 and the driver functional block 1130. If needed, the bus sparing logic 1138 may re-direct the signals to account for a defective segment between the current memory module 806 and the upstream receiving module (or memory controller). The driver functional block 1130 transmits the original or re-ordered signals, via the upstream memory bus 902, to the next memory assembly (i.e., memory module 806) or memory controller 802 in the chain. In an exemplary embodiment of the present invention, the bus sparing logic 1138 is implemented using a multiplexor to shift the signals. The driver functional block 1130 provides macros and support logic for the upstream memory bus 902 and, in an exemplary embodiment of the present invention, includes support for a twenty-three bit, high speed, low latency cascade driver bus.

Data, clock, and ECC signals from the upstream memory bus 902 are also received by any upstream multi-mode buffer device 1002 in any upstream memory module 806. These signals need to be passed upstream to the next memory module 806 or to the memory controller 802. Referring to FIG. 11, data, ECC and clock signals from a downstream memory assembly (i.e., a memory module 806) are received on the upstream memory bus 902 into a receiver functional block 1134. The receiver functional block 1134 provides macros and support logic for the upstream memory bus 902 and, in an exemplary embodiment of the present invention includes support for a twenty-three bit, high speed, slave receiver bus. The receiver functional block 1134 passes the data and ECC signals, through the bus sparing functional block 1140, to the upstream data multiplexing functional block 1132 and then to the bus sparing logic block 1138. The signals are transmitted to the upstream memory bus 902 via the driver functional block 1130.

In addition to passing the data and ECC signals to the upstream data multiplexing functional block 1132, the bus sparing functional block 1140 also inputs the original or re-ordered data and ECC signals to the upstream bus ECC functional block 1122 to perform error detection and correction for the frame. The upstream bus ECC functional block 1122 operates on any information received or passed through the multi-mode buffer device 1002 from the upstream memory bus 902 to determine if a bus error is present. The upstream bus ECC functional block 1122 analyzes the data and ECC signals to determine if they are valid. Next, the upstream bus ECC functional block 1122 transfers any error flags and/or error data to the pervasive and miscellaneous functional block 1110 for transmission to the memory controller 802. In addition, once a pre-defined threshold for the number or type of failures has been reached, the pervasive and miscellaneous functional block 1110, generally in response to direction of the memory controller 802, may substitute the spare segment for a failing segment.

The block diagram in FIG. 11 is one implementation of a multi-mode buffer (or hub) device 1002 that may be utilized by exemplary embodiments of the present invention. Other implementations are possible without departing from the scope of the present invention.

FIG. 12 is a table that includes a representative sample of the applications and operating modes of exemplary buffer devices. Three types of buffer modes 1208 are described: buffered DIMM 1202; registered DIMM 1204; and unbuffered DIMM 1206. The "a" and "b" bus that are output from the memory command interface 1108 can be logically configured to operate in one or more of these modes depending on the application. The table includes: a ranks column 1210 that contains the number of ranks per DIMM; a chip select (CS) column that contains the number of buffer CS outputs used, in addition to the loads per CS; a clock column 1214 that contains the number of buffer clock pairs used and the loads per clock pair; and a miscellaneous column 1216 that includes wiring topology information. A load refers to a receiver input to a DRAM, register, buffer, PLL or appropriate device on the memory module 806.

As indicated in FIG. 12, the exemplary buffered DIMM implementation supports up to nine memory devices per rank, with each device having an eight bit interface (seventy-two bits total). If all eight ranks are populated on a given module constructed of current one gigabit devices, the total memory density of the module will be eight gigabytes. As evident by the table entries under the CS column 1212 (the CS is generally utilized on DIMMs as a rank select to activate all the memory devices in the rank) and the clock column 1214, the varying loads and net structures require different driver characteristics (e.g., drive strength) for the multi-mode buffer device 1002. In addition, as the registered DIMMs generally add a single clock delay on all inputs that pass through the register on the DIMM (address and command inputs), the multi-mode buffer device 1002 needs to accommodate the extra clock of latency by ensuring accurate address and command-to-data timings. Further, the unbuffered DIMMs, as well as the heavily loaded buffered DIMM applications often require two-transition (2T) addressing, due to heavy loading on address and certain command lines (such as row address strobe (RAS), column address strobe (CAS) and write enable (WE)). In the latter case, the buffer operates such that these outputs are allowed two clock cycles to achieve and maintain a valid level prior to the CS pin being driven low to capture these DRAM inputs and initiate a new action.

In a further exemplary embodiment, the buffered DIMM implementation supports up to eighteen memory devices per rank, with each device having a four bit interface (also yielding seventy-two bits total). If four ranks are populated on a given module constructed of planned four gigabit devices, the total memory density of the module will be one hundred twenty eight gigabytes. Other exemplary embodiments may be produced with only 64 bits per rank, 80 bits per rank or other data widths consistent with the system data widths and/or data fault-tolerant needs/capabilities.

The terms "net topology" in FIG. 12 refer to a drawing and/or textual description of a wiring interconnect structure between two or more devices. A "fly-by-topology" is a wiring interconnect structure in which the source (driver) is connected to two or more devices that are connected along the length of a wire, that is generally terminated at the far end, where the devices along the wire receive the signal from the source at a time that is based on the flight time through the wire and the distance from the source. A "T" net topology is a wiring interconnect structure that includes a source (driver) that is connected to two or more devices through a wire that branches or splits. Each branch or split is intended to contain similar wire length and loading. In general, a single wire will split into two branches from a single branch point, with each branch containing similar line length and loading. Inputs wired to a single register or clock are generally considered to be point-to-point. Inputs wired to multiple registers or PLLs are generally wired in a "T" net structure so that each receiver receives the input at approximately the same time, with a similar waveform. The "T" nets defined above are typically not end-terminated, but generally include a series resistor termination in the wire segment prior to the branch point.

Figure 13:
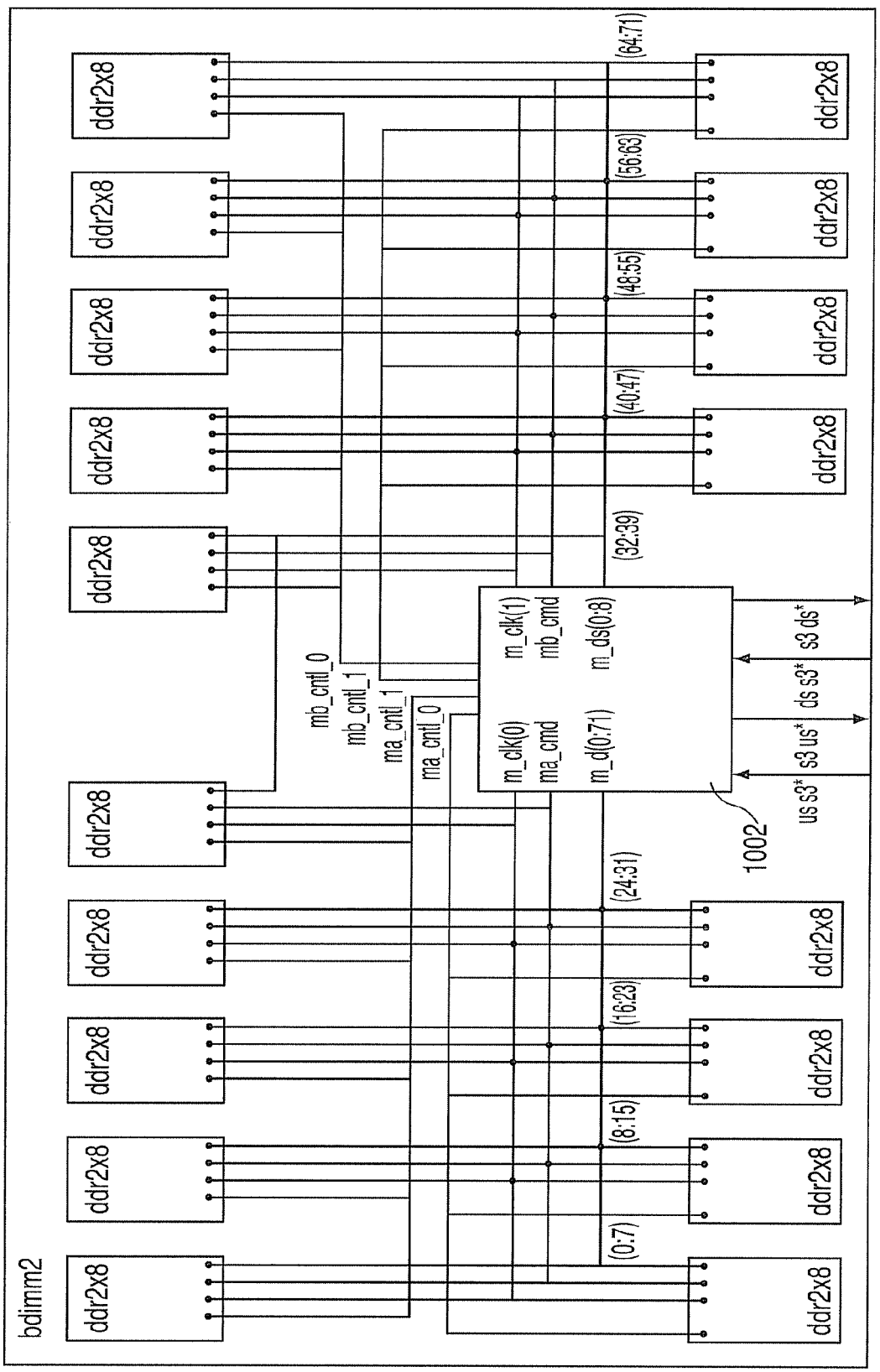
FIG. 13 is a simplified block diagram of a buffered DIMM produced with a multi-mode buffer device that may be utilized by exemplary embodiments of the present invention.

FIG. 13 is a simplified block diagram of a buffered DIMM memory module with the multi-mode buffer device 1002 that may be utilized by exemplary embodiments of the present invention. It provides an example of the net structures and loading associated with a two rank buffered DIMM produced with eighteen DDR2 eight bit memory devices, consistent with the information in the table in FIG. 12. The CS and clock signals are wired in a fly-by structure, the lines shown in the drawing from the mainline wire to each memory device appear to be long only to simplify the drawing. The fly-by net end-termination is not shown, but is included in the exemplary embodiment.

Figure 14:
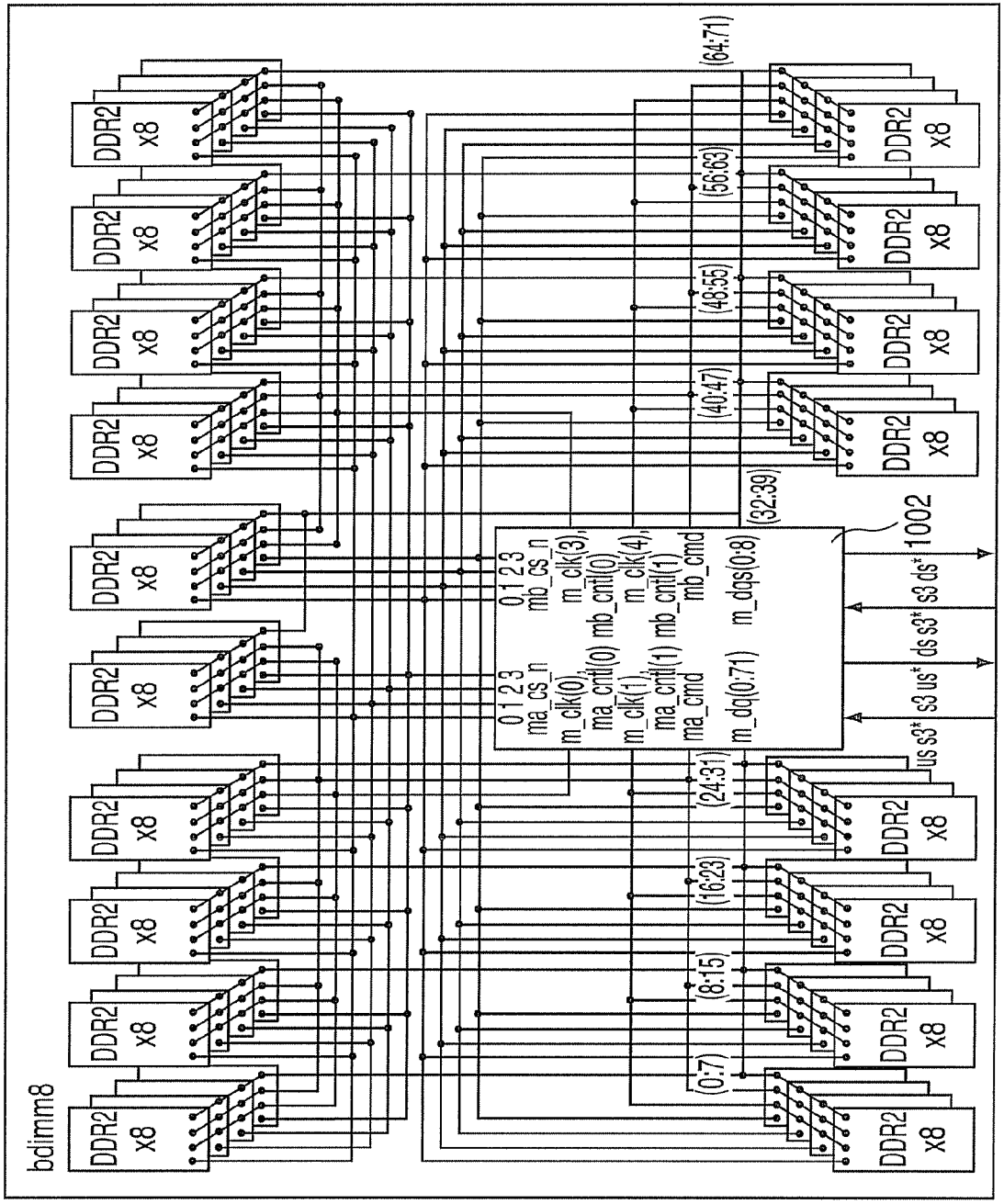
FIG. 14 is a simplified block diagram of a buffered DIMM produced with a multi-mode buffer device that may be utilized by exemplary embodiments of the present invention.

FIG. 14 is a simplified block diagram of a buffered DIMM memory module 806 produced with a multi-mode buffer device 1002 that may be utilized by exemplary embodiments of the present invention. It provides an example of the net structures and loading associated with an eight rank buffered DIMM memory module 806 produced with eight bit memory devices, consistent with the information in the table in FIG. 12. Each CS output controls nine memory devices (seventy-two bits) in this example, whereas each CS controls four or five (thirty-two to forty bits) in FIG. 13.

Figure 15:
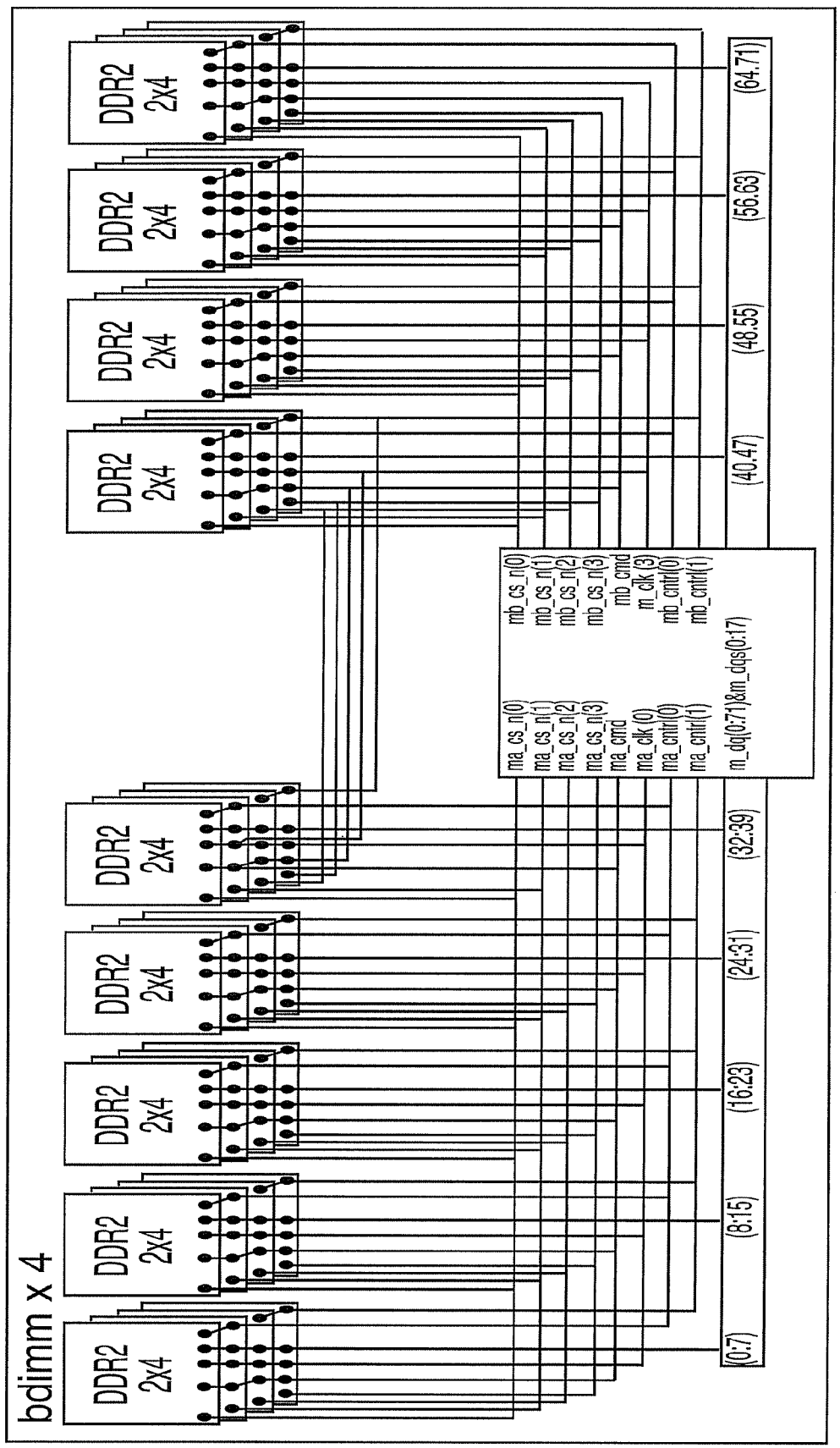
FIG. 15 is a simplified block diagram of a buffered DIMM produced with a multi-mode buffer device that may be utilized by exemplary embodiments of the present invention.

FIG. 15 is a simplified block diagram of a buffered DIMM memory module 806 produced with a multi-mode buffer device 1002 that may be utilized by exemplary embodiments of the present invention. It provides an example of the net structures and loading associated with a four rank buffered DIMM memory module 806 produced with four bit memory devices—where each memory block shown is composed of two, 4 bit devices which share a common CS input (yielding 8 bits). Each CS output controls eight or ten memory devices in this example, whereas each CS controls four or five (also thirty-two to forty bits) in FIG. 13. As described earlier, the increased loading on the CS and address outputs may necessitate operation at lower data rates than would be possible with single rank, eight bit-based modules—however improved fault-tolerance may be obtained due to the reduced number of bits that would be affected by a failing memory device (4 bits instead of 8 bits).

FIG. 16 (including FIGS. 16a, 16b and 16c) is a table illustrating a functional pin layout of the exemplary 276-pin DIMM of FIG. 10, in accordance with an exemplary embodiment. In addition to the layout and approximate distance (millimeters) from the key of each pin, FIG. 16 also provides a functional description of each of the pins, including those used as redundant pins and those used for special control functions. Those pins that are used as redundant pins are designated in FIG. 16 using the suffix "_r". As indicated previously, designated pins 1-138 run from left to right on the front side of the DIMM, with pins 139-276 located behind pins 1-138 when viewing the front side of the DIMM.

In an exemplary embodiment, each of the redundant pins is located behind the respective primary function pin for which it is redundant. For example, redundant FRU (field replaceable unit) service interface pins fsi0_data_r and fsi1_data_r (pins 199, 200) are located directly behind FRU service interface pins fsi0_data and fsi1_data (pins 61, 62), respectively. In this manner, the DIMM is resistant to single point-of-fail memory outage (e.g., such as if the DIMM were warped or tilted toward one side or the other).

Among the various functions included within the 276-pin layout are a pair of scope trigger pins (3, 141), a vref (voltage) test pin (2) and fault (error) pins (4, 142). As will be appreciated from an inspection of the pin assignment table in FIG. 16, the signal pins (also referred to as "high-speed bus interface pins") associated with each of the four high-speed busses are grouped on one side (to the left or right) of the midpoint 1006, with either a signal voltage (e.g. 1.2V) or ground pin included between each two high-speed signals (or high-speed bus interface pins). Having all of the high-speed bus interface pins associated with a single high-speed bus located on one side of the card with respect to the midpoint 1006 of the length of the card and having a voltage or ground pin included between each of the high-speed bus interface signals will lead to an improvement in signal integrity and module operating frequency.

As will also be noted from FIG. 16, the pin layout provides for power at both a first voltage level (e.g., 1.8 volts) and a second voltage level (e.g., 1.2 volts, as shown at pins 54, 191, 80 and 217). In this manner, the logic portion of the system may be operated independent of and/or prior to powering up the main memory portion of the system, thereby providing additional system memory usage flexibility and/or power savings.

Figure 17:
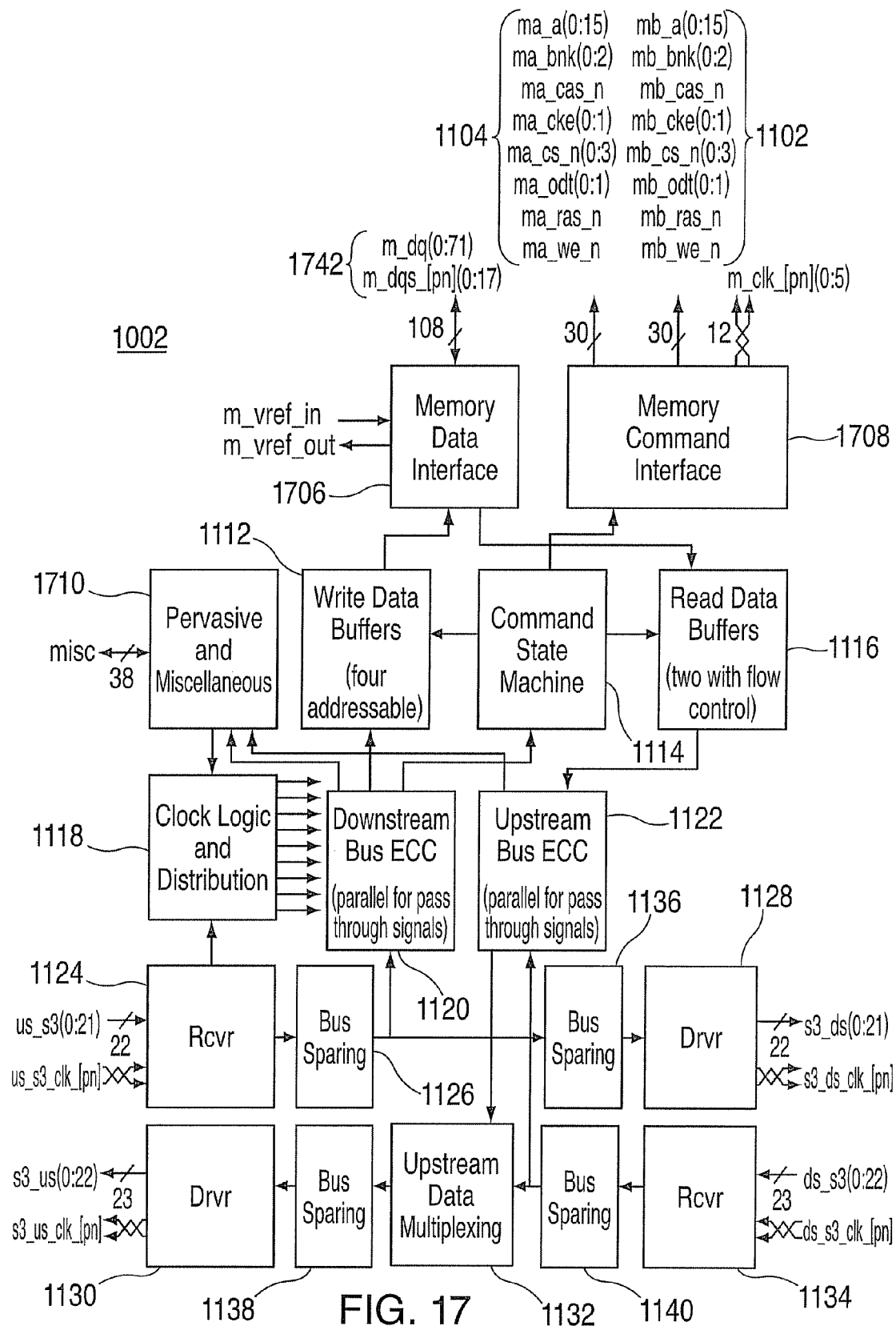
FIG. 17 is a block diagram of a multi-mode buffer device high level logic flow that may be utilized by exemplary embodiments of the present invention.

FIG. 17 is a block diagram of a multi-mode buffer device high level logic flow that may be utilized by exemplary embodiments of the present invention. It is the same as the logic flow depicted in FIG. 11, except that the number of signals have been modified where required to accommodate the use of four bit memory devices and to improve operability and diagnostic capability. For example, the memory device interface 1706 in FIG. 17 performs the same functions as the memory device interface 1106 described in reference to FIG. 11, except that the memory device interface 1706 transmits and/or receives 108 signals rather than 90 due to the addition of 9 differential strobe pairs (18 total signals). The memory data 1742 m_dq(0:71) continues to include 72 bits that are read and written by the memory data interface 1706. The pervasive and miscellaneous functional block 1710 transmits and/or receives 38 signals but otherwise performs the same functions described previously with respect to the pervasive and miscellaneous functional block 1110 in FIG. 11.

Exemplary embodiments include a computing system with a processor(s) and an I/O unit(s) (e.g., requestors) interconnected to a memory system that contains a memory controller and memory devices. In exemplary embodiments, the memory system includes a processor or memory controller interfaced to a set of hub devices (also referred to as "hub chips"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

Figure 1:
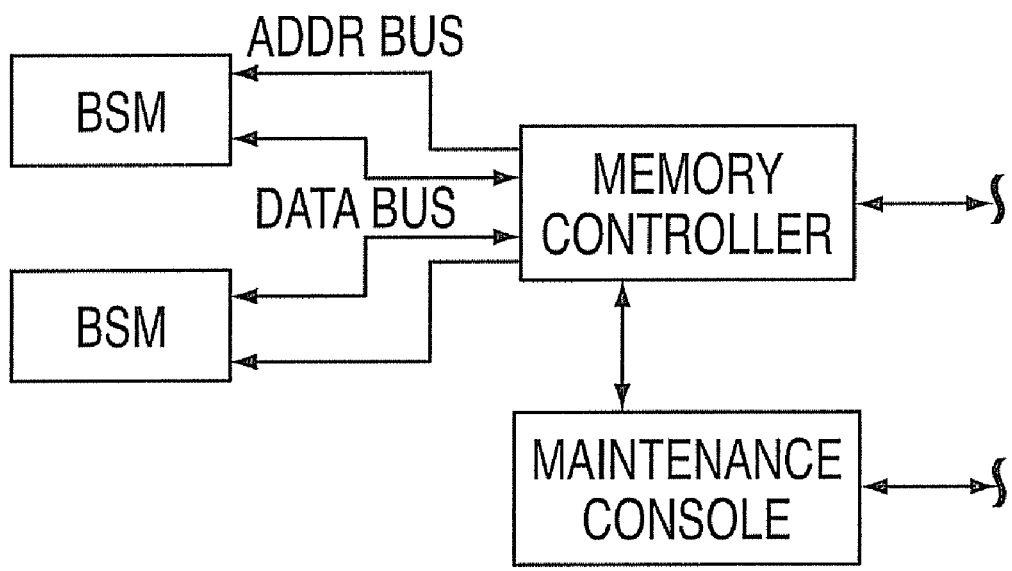
FIG. 1 depicts a prior art memory controller connected to two buffered memory assemblies via separate point-to-point links.
Figure 2:
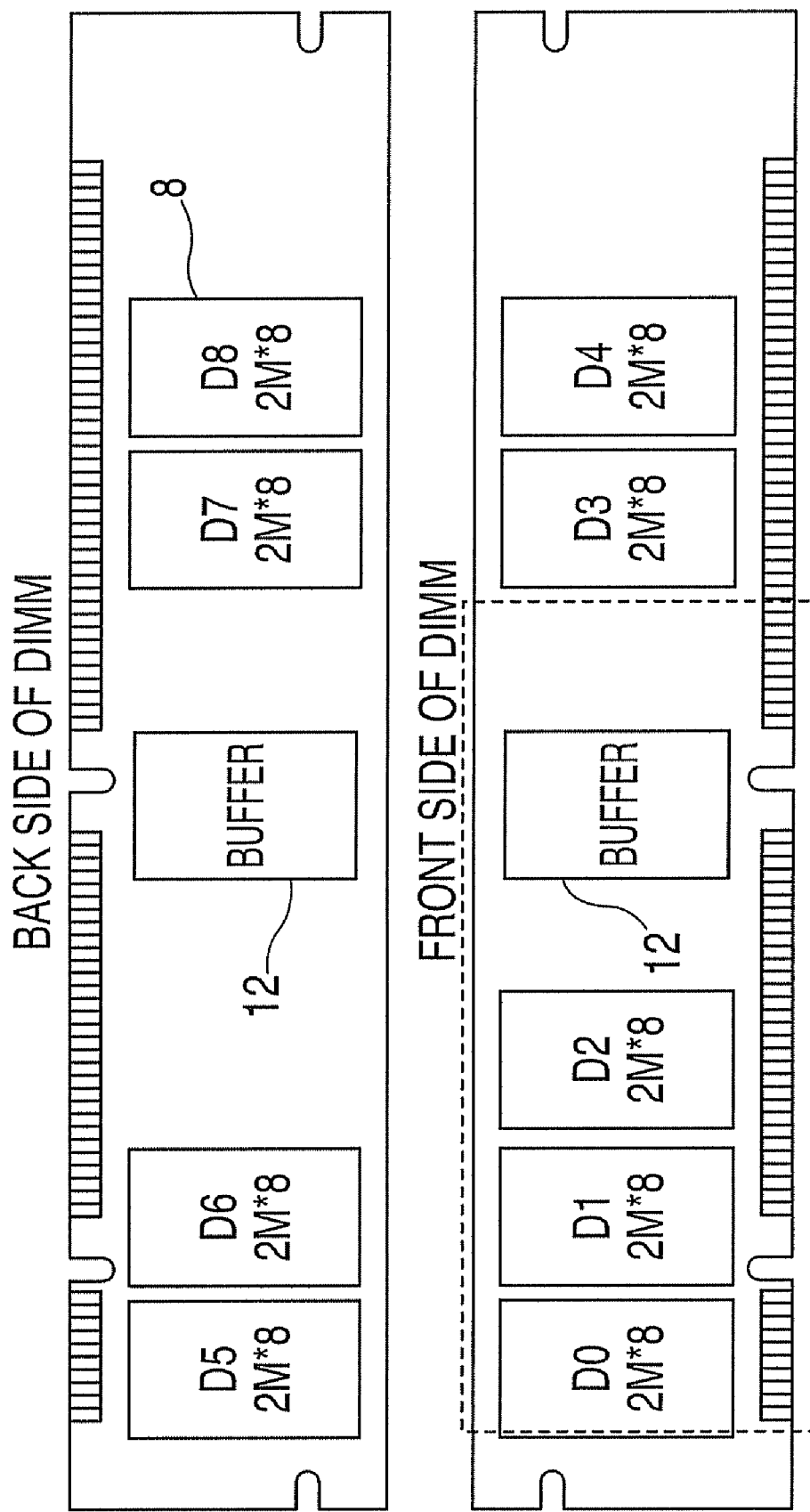
FIG. 2 depicts a prior art synchronous memory module with a buffer device.
Figure 3:
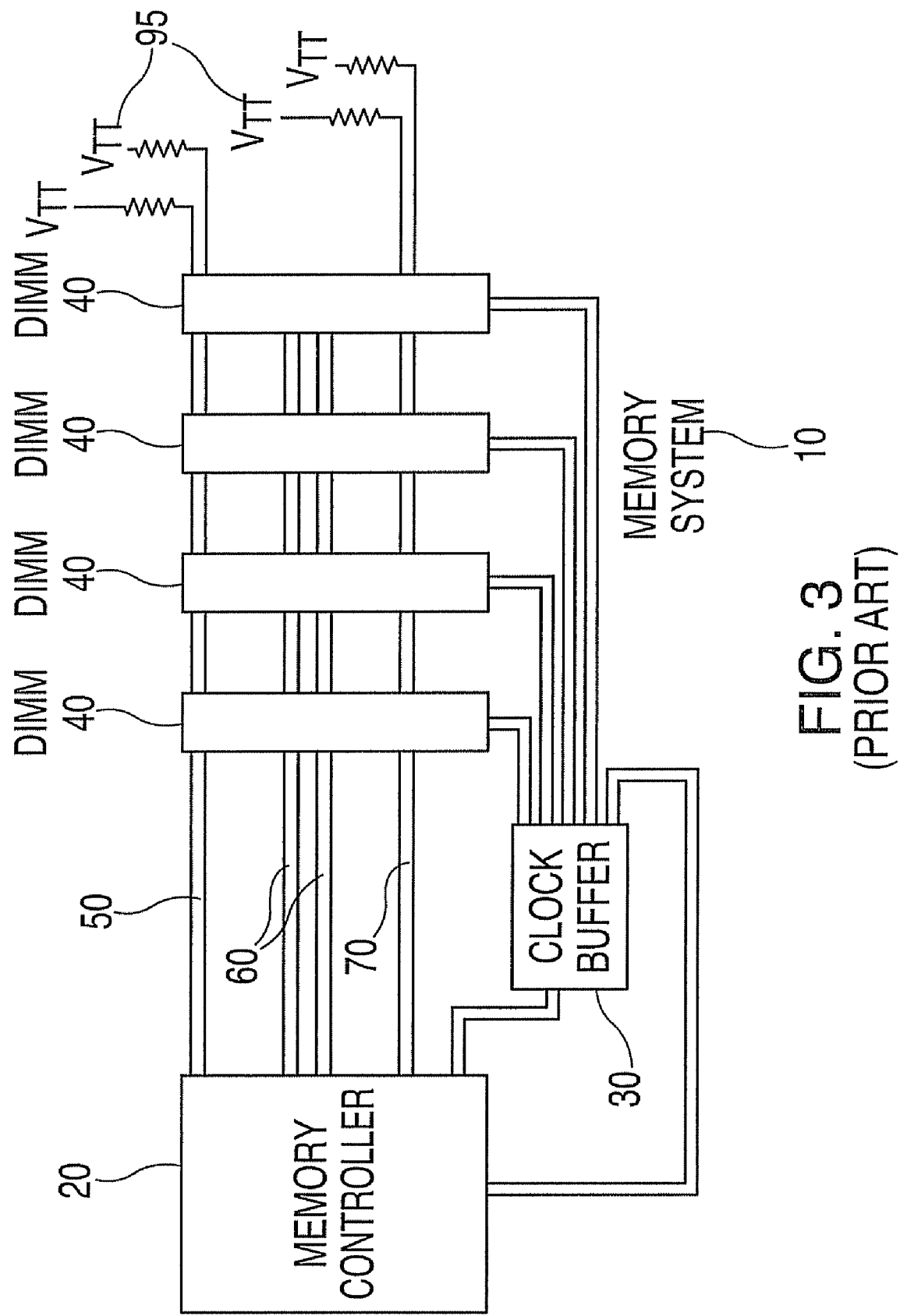
FIG. 3 depicts a prior art memory subsystem using registered DIMMs.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 2 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/ or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency(ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CDROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A dual inline memory module (DIMM), comprising:
   a card having a length of about 151.2 to about 151.5 millimeters;
   a plurality of individual local memory devices attached to said card;
   a buffer device attached to said card, said buffer device configured for converting a packetized memory interface;
   said card including at least 276 pins configured thereon including a plurality of high-speed bus interface pins arranged on said card for communicating with a plurality of high-speed busses, such that the high-speed bus interface pins associated with a single high-speed bus are located on one side of the card with respect to a midpoint of the length of the card; and
   said at least 276 pins further include a pair of service interface pins located at the front and backside pin positions located 21.5 mm to the left of the notch, as viewed from the front of the DIMM.

2. The DIMM of claim 1, further comprising a positioning key formed on said card, wherein said positioning key is located at a non-center position with respect to a length of the card.

3. The DIMM of claim 1, wherein said at least 276 pins are arranged in a first row of pins and a second row of pins behind said first row.

4. The DIMM of claim 3, further comprising a plurality of redundant pins among said at least 276 pins, wherein a given redundant pin with respect to a given primary function pin is located directly behind said primary function pin.

5. A dual inline memory module (DIMM), comprising:
   a card having a length of about 151.35 millimeters;
   a plurality of individual local memory devices attached to the card;
   a buffer device attached to the card, said buffer device configured to re-drive information to one or more external memory modules in a cascading manner;
   a plurality of high-speed bus interface pins arranged on said card for communicating with a plurality of high-speed busses, such that the high-speed bus interface pins associated with a single high-speed bus are located on one side of the card with respect to a midpoint of the length of the card; and
   a plurality of at least 276 pins formed on said card, the 276 pins including the high-speed interface pins and one or more fault reporting pins, with at least one fault pin nominally located 78.5 mm to the left of a positioning key as viewed from the front of the DIMM.

6. The DIMM of claim 5, wherein at least one positioning key is located at a non-center position with respect to a length of the card.

7. The DIMM of claim 5, wherein said at least 276 pins are arranged in a first row of pins and a second row of pins behind said first row.

8. The DIMM of claim 7, further comprising a plurality of redundant pins among said at least 276 pins, wherein a given redundant pin with respect to a given primary function pin is located directly behind said primary function pin.

9. A computer memory system, comprising:
   a memory controller device; and
   a first dual inline memory module (DIMM) coupled to said memory controller device through a set of at least two single-ended busses, said first DIMM comprising a card having a length of about 151.2 to about 151.5 millimeters, a plurality of individual local memory devices attached to said card, and a buffer device attached to said card, said buffer device configured for converting a packetized memory interface, and said card including a plurality of high-speed bus interface pins arranged on said card for communicating with a plurality of high-speed busses, such that the high-speed bus interface pins associated with a single high-speed bus are located on one side of the card with respect to a midpoint of the length of the card;

wherein said first DIMM further comprises a plurality of at least 276 pins formed on said card, the 276 pins including the high-speed bus interface pins and a vref test pin located on the front of the card at a nominal distance of 80.5 mm to the left of the positioning key, as viewed from the front of the DIMM.

10. The computer memory system of claim 9 further comprising error code correction (ECC) logic for identifying and correcting bus faults.

11. The computer memory system of claim 9 wherein either a signal voltage or a ground pin is included between each two high-speed bus interface pins.

12. The computer memory system of claim 9, wherein at least one positioning key is located at a non-center position with respect to said length of the card.

13. The computer memory system of claim 9, wherein said at least 276 pins are arranged in a first row of pins and a second row of pins behind said first row.

14. The computer memory system of claim 13, further comprising a plurality of redundant pins among said at least 276 pins, wherein a given redundant pin with respect to a given primary function pin is located directly behind said primary function pin.

* * * * *